United States Patent [19]

Lindmayer

[11] 4,320,168
[45] Mar. 16, 1982

[54] METHOD OF FORMING SEMICRYSTALLINE SILICON ARTICLE AND PRODUCT PRODUCED THEREBY

[75] Inventor: Joseph Lindmayer, Bethesda, Md.

[73] Assignee: Solarex Corporation, Rockville, Md.

[21] Appl. No.: 968,039

[22] Filed: Dec. 11, 1978

Related U.S. Application Data

[63] Continuation-in-part of Ser. No. 916,545, Jun. 19, 1978, Pat. No. 4,213,259, Ser. No. 751,342, Dec. 16, 1976, abandoned, and Ser. No. 751,343, Dec. 16, 1976.

[51] Int. Cl.³ .......................................... H01L 21/306
[52] U.S. Cl. ..................................... 428/332; 29/572; 136/261; 136/264; 148/187; 156/647; 156/648; 156/657; 357/20; 357/30; 428/620
[58] Field of Search ......................... 29/572, 573, 580; 357/15, 17, 19, 20, 30; 156/628, 647, 657, 648, 662, 649; 252/79.3, 79.5; 136/89 R, 89 TF, 89 SG, 89 SJ, 89 CC, 89 P; 428/141, 144, 156, 167, 170, 221, 332, 333, 357, 361, 402–404, 446, 620, 623; 148/187, 179

[56] References Cited

U.S. PATENT DOCUMENTS

| | | | |
|---|---|---|---|
| 2,902,419 | 9/1959 | Carasso | 156/662 X |
| 2,904,613 | 9/1959 | Paradise | 156/648 X |
| 3,007,830 | 11/1961 | Bardsley | 156/662 |
| 3,429,756 | 2/1969 | Groves | 156/662 X |
| 3,480,818 | 11/1969 | TeVelde | 29/572 X |
| 4,155,785 | 5/1979 | Cuomo et al. | 29/572 X |

Primary Examiner—William A. Powell
Attorney, Agent, or Firm—Watson, Cole, Grindle & Watson

[57] ABSTRACT

A method of forming a semicrystalline silicon solar energy cell having individual grains of silicon at the light-receiving surface of the cell. Impurities in the silicon concentrated in the grain boundaries are removed by etching away at least substantial portions of the boundaries at the wafer surface and between adjoining grains so that, upon subsequent diffusion, a photovoltaic junction will be formed at the light-receiving surface and will extend into the interior of the wafer between adjoining grains.

10 Claims, 3 Drawing Figures

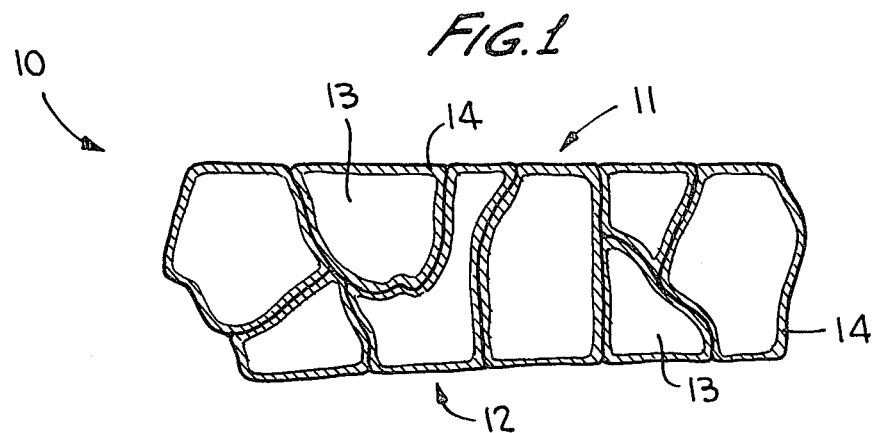
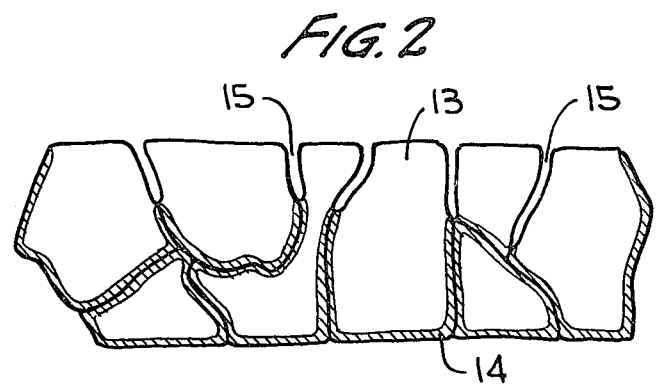
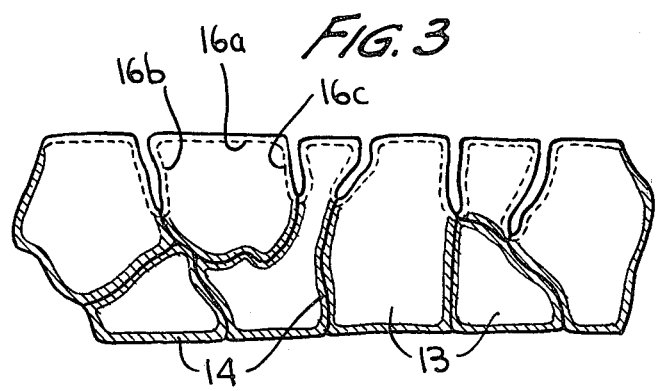

METHOD OF FORMING SEMICRYSTALLINE SILICON ARTICLE AND PRODUCT PRODUCED THEREBY

This application is a continuation-in-part of my copending application Ser. No. 916,545, filed June 19, 1978, now U.S. Pat. No. 4,213,259, and entitled, Semicrystalline Silicon Article and Method of Making the Same. It is also a continuation-in-part of my copending application Ser. No. 751,342, now abandoned, entitled, Method of Producing Semicrystalline Silicon and Product Formed Thereby, and application Ser. No. 751,343 etitled, Method of Purifying Silicon, said last-named applications having been filed on Dec. 16, 1976.

The present application relates in general to a method of making a semiconductor article formed of silicon. More particularly it is concerned with photovoltaic solar energy cell that has been formed from what I prefer to term, semicrystalline silicon, which is silicon in the form of regular or irregular grains having an average mean diameter of at least about 100 microns, and preferably more than one millimeter.

As has been recited in greater detail in my application Ser. No. 751,342, the invention of that application as well as the present invention are concerned with the discovery that silicon of a structure other than single or monocrystalline silicon, which is the conventional host material from which photovolatic cells are formed, maybe utilized to make efficient photovoltaic cells. While what has been termed polycrystalline silicon is well known in the art and is a general term that refers to many varieties of silicon other than monocrystalline, I have discovered that silicon of a grain size of at least 100 microns, and preferably in the order of millimeters in diameter, is so structured that is may well be used to form a photovoltaic cell. In particular, when such grains are highly ordered so far as their crystallographic structure is concerned, it has been found that most of their structural defects will be concentrated at the grain boundaries. Other than at the grain boundaries, i.e., in the interiors of the grains, the crystallographic order is far more free of defects. It has also been found that impurities are likewise located at the edges of the grains. Thus, since defects and impurties are concentrated at the grain boundaries, it is possible to utilize semicrystalline silicon wafers for solar cells when a junction has been created therein in a manner such that the minority carriers of the electron-hole pairs will not be interrupted by those defects and impurities of the semicrystalline silicon grains, or at least where defects and impurities have been largely minimized. To this extent, it is advisable to purify the grains, for example, in the manner set forth in my copending application Ser. No. 751,343. However, the present invention is based on the concept that, where defects and impurities are concentrated at the grain boundaries, a p-n junction can still be formed in the grains, themselves, after first removing substantial portions of at least some of the grain boundaries.

It is, therefore, a primary object of the present invention to provide a silicon solar energy cell in which the silicon is semicrystalline silicon, i.e., silicon having at one surface of the wafer grains of an average mean diameter of at least about 100 microns. It is another object of the invention to form such a photovoltaic cell in which the efficiency of production of energy from that cell will be quite satisfactory and, although perhaps not the precise equal of a cell that might be produced under comparable circumstances from monocrystalline silicon, will be such that the efficiency-to-expense ratio will be markedly superior to that for monocrystalline silicon solar energy cells.

In essence, the present invention contemplates a method of making a photovoltaic solar energy cell from a silicon wafer having the usual opposed major surfaces, one adapted for the impingement of light thereon, the other for forming a back contact. At least at its front, light-impinging surface the wafer is composed of grains of semicrystalline silicon having a mean diameter preferably in the order of millimeters and grain boundaries abutting those of adjoining grains. Most importantly, here portions of the grain boundaries are etched away or otherwise removed, either in whole or in part, so that thereafter a p-n junction can be formed inwardly of that impingement surface. The p-n junction extends across and below the surface and also preferably into the sides of the individual grains where the boundaries of those grains have been etched away so that the grains are slightly separated from each other. In this manner the imperfections inherent in semicrystalline silicon can in large part be removed at those regions of the wafer where their presence is most concentrated. Removal of grain boundaries enables diffusion of a junction in the cavities formed between adjoining grains by the etching process, so that the product of the linear dimensions of the wafer surface is far exceeded by the total area of the photovoltaic junction. However, the junction does not extend completely around the perimeter of individual silicon grains.

In the present invention, the key to successful diffusion, or other mode of forming a p-n junction in a silicon wafer, is the removal of the grain boundaries at the surface of the wafer that will become the light-receiving surface of the solar cell. Generally, those grain boundaries have been found to be removed most easily by means of a etchant. Indeed, after experimentation with various compositions, it has been found that a preferred etch is an acid that will preferentially attack and dissolve those regions of the semicrystalline silicon wafers that contain the highest degree of impurities and least ordered crystalline structure, which happen to be the grain boundaries. Such an etch has been most advisably found to be one containing nitric acid and hydrofluoric acid. That etch which has been most successfully used is an mixture of nitric, hydrofluoric and acetic acids, with a ratio of about 2-1-1. However, an alkaline etch, e.g., sodium hydroxide, is also a preferred mode of carrying out the etching step of my method.

After etching has been concluded, the thickness of the silicon wafer will have been substantially reduced, according to the original thickness of the wafer. Generally, the less the original thickness of the wafer, the greater the percentage of that thickness that will have been removed. Moreover, a photovoltaic solar energy cell will have been produced in which grains of semicrystalline silicon having mean diameter of at least about 100 microns will be formed into a wafer in which substantial portions if not all of the boundaries of the grains have been removed. At the surface of the wafer grain the boundary regions will have been removed and the interiors of the crystals exposed. Cavities will be formed between adjoining grains, those cavities extending inwardly for perhaps one-quarter to one-half of the depth of the grains, so that at the surface portion of the wafer, adjoining grains will be separated from each other by such cavities or crevices. Then, after a photovoltaic junction has been formed at the impingement surface, that junction will extend not only along the impingement surface but into the cavities and then into the interiors of the grains. In this manner an increased junction area may be achieved, and the boundaries of silicon grains, where the silicon is less well ordered and impurities are concentrated, will also have been removed. As a result of the increased junction area, which may be evidenced by an increase of five or even ten times the capacity of the cell over what would be expected from a planar junction, there is easier access to the p-n junction by minority carriers of the electron-hole pairs generated.

These and other objects, features and advantages of my invention will become more apparent when considered in connection with the accompanying drawing of a preferred embodiment thereof, which drawing forms a part hereof and in which:

FIG. 1 is a schematic illustration of semicrystalline silicon wafer of structure preferred as a starting material for the present process;

FIG. 2 shows the wafer FIG. 1 after etching according to invention, and

FIG. 3 illustrates the etched wafer of FIG. 2 after a photovoltaic junction has been formed therein.

Referring now to the drawing and to FIG. 1 in particular, a silicon wafer suitable for being formed into a solar energy cell in accordance with my herein disclosed process is indicated generally by reference numeral 10. The wafer has at the front surface 11, which is adapted to receive light impinging thereon, and a back surface 12 which is to receive back contacts that will function to complete the circuit.

As will be apparent, at least the front surface of the wafer is formed from irregular grains 13 of semicrystalline silicon. Preferably, the silicon has been produced in accordance with the practice of my copending application Ser. Nos. 751,342 and 751,343. With respect to these individual grains 13 they generally abut each other although in wafer formed they may at the front surface 11 of the wafer, have some small spaces between them. While the grains are not the purity of the monocrystalline silicon, they have their impurities and defects concentrated at the grain boundaries, which regions are designated by reference numeral 14. In their interiors, the crystallographic order and purity of silicon grains 13 is satisfactory and suitable for use in making solar cells. By this I mean that there is a sufficient continuum of silicon, uninterrupted by defects in the crystallographic structure and impurities, such that recombination of minority carriers is minimized to an extent whereby economically efficient solar cells may be produced.

As illustrated diagramatically, the wafer 10 of semicrystalline silicon grains 13 is now subjected etching to produce the etched wafer illustrated in FIG. 2. Such etching may be carried out using different etchants. In some instances a preferred etch will be a caustic solution, e.g., an alkali metal hydroxide. If an acid is used, I prefer a mixture of concentrated nitric, acetic and hydrofluoric acids in a ratio of 2-1-1 because that acid etching can be used at room temperature and because the desired degree of removal can be accomplished by immersion in that acid solution for a relatively short period, e.g., one minute. However, an alkaline etch tends to be more preferential. Thus, an aqueous solution of sodium hydroxide at 100° C. will also effectively etch away substantial portions of the grain boundary regions of the semicrystalline silicon grains, when applied in almost any concentration between 10% by weight of a saturated NaOH solution in about 10 to 15 minutes of immersion.

With respect to etching silicon grains when impurities and defects in the crystallographic structure are concentrated in the grain boundaries, it has been found that etching utilizing either an acid or an alkaline etchant is carried out in a preferred manner. Thus, by the term, preferential etch, I refer to the phenomenom by means of which these etchants will more readily attack and dissolve relatively disorganized crystalline structures, specifically, disorganized silicon crystals, rather than highly organized silicon. This preferential etch characteristic is highly advantageous in the etching of a wafer of semicrystalline silicon according to the present invention, because less precise control over etching is required. Since etching of crystallographically disorganized silicon takes place more readily than that of highly ordered silicon, the preferential etch treatment may be carried out without undue risk of losing quantities of highly ordered silicon while removing the necessary amount of disorganized silicon.

After preferential etch has been effected, the wafer is removed from the etchant bath, water-washed and dried. The wafer then has a structure as exemplarily illustrated in FIG. 2 of the drawings. For illustrative purposes, the grain boundaries 14 are shown as having been entirely removed at the front surface 11 of the wafer 10. In place thereof, cavities or crevices 15 have been created between adjoining grains 13, which grains, or at least those at surface 11 of wafer 10, are now of somewhat reduced dimensions. The grain boundary regions 14 constituting the light-impingement surface 11 have been removed. Cavities 15 extend inwardly from the front surface 11 of the wafer 10 in more or less random fashion according to the shape and contact areas of grains themselves. At this stage of the process, what has been formed is a silicon wafer of randomly arranged grains of semicrystalline silicon in which the purity of the silicon and degree of crystallographic order thereof have been substantially enchance.

The wafer 10 of FIG. 2 is now subjected to state-of-the-art techniques to form a photovoltaic junction at the new front surface 11 of the wafer. That junction is referred to by numerals 16a, b and c in the illustration of FIG. 3 of the drawing.

By way of example, when the wafer 10 has been formed from semicrystalline silicon previously doped with boron, diffusion will advantageously be carried out with phosphorus to form an n-p junction adjacent to the front surface of the cell. That n-p junction does not simply occupy the plane of the cell surface, but also follows the contour created by the cavities 15, and thus, penetrates the interior of the wafer, itself. When phosphorus has been diffused into the front surface of a semicrystalline wafer that has been doped with boron, the n-p junction so formed will attract electrons. Consequently, when photons of light enter the interior of grain 13 of semicrystalline silicon at the surface 11 of the wafer, the electrons of the electron-hole pairs so generated will, on the whole, have a lesser distance to travel to reach the p-n junction.

It will be apparent that when an electron has been generated near the front surface of the wafer, the electron will travel toward the nearest portion of the p-n junction, which may be that portion 16a of the junction near the surface of the grain. However, when the electron-hole pairs are generated inwardly of grain 13, it may well be that the electrons of the pairs are closer to side junction portions 16c and 16b. As a consequence, the fact that the junction does extend inwardly will mean that the electrons can move laterally and will have a shorter distance to travel in order to reach the photovoltaic junction formed in wafer 10. Therefore, there is a greater likelihood that the electrons will reach that junction unimpaired and will not recombine with a hole before reaching the junction.

With respect to the specific means for carrying out certain of the method steps according to my invention, the starting material, that is, the semicrystalline silicon, may be formed in accordance with my application Ser. No. 751,342, preferably purified as disclosed in my application Ser. No. 751,343. For the diffusion step use a mixture of phosphine, helium and oxygen as is also known in the art, such process having been disclosed in my U.S. Pat. No. 4,028,151, which is incorporated herein by reference where its disclosure is required. When the silicon has been doped with boron prior to cooling to semicrystalline form, I have found it most convenient to use phosphine as a diffusant. Diffusion may be carried out in the furnace at about 880° C. for 15 minutes.

After a p-n junction has been formed in the silicon wafer, a coating of aluminum of about 5,000 Å thickness is applied to the back surface of the wafer, and the aluminum is alloyed through the glass that has been formed on the back surface in accordance with my U.S. Pat. No. 3,990,097, which is likewise incorporated by reference herein where requisite. A contact is then applied to the back surface and a grid-type contact to the front surface of the wafer in manners also well known to those skilled in the art. The result is a photovoltaic cell formed from semicrystalline silicon, which cell is of satisfactory or more than satisfactory efficiency.

While the present invention has been described by way of specific examples, it will be apparent to those skilled in the art that considerable variations may be made in those specific examples yet come within the scope of my invention. As a consequence, it is desired that the purview of my invention include the best modes recited hereinbefore and likewise extend to obvious modifications, alterations and substitutions therein that would become apparent to those of skill in this art after reasonable experimentation. Those alterations, modifications and substitutions are desired to be included within the present invention, which is to be limited in its scope only by the following, appended claims.

I claim:

1. A method of making a photovoltaic cell from a wafer of semicrystalline silicon having a surface adapted for the impingement of light thereon, said surface being formed from individual grains of silicon having a mean diameter of at least about 100 microns and grain boundaries that at said surface are in contact with or separated only slightly from the boundaries of adjoining grains and in which boundaries impurities and crystallographic defects are concentrated, comprising subjecting said impingement surface to etching that will preferentially attack said grain boundaries as compared with the interiors of said grains until at least a substantial portion of the grain boundaries at said surface have been removed and grooves have been formed in said surface between said adjoining grains thereat, and then forming a photovoltaic junction inwardly of said impingement surface of said wafer.

2. A method of making a photovoltaic cell as claimed in claim 1, in which said etching is carried out by the use of an aqueous, acidic solution.

3. A method of making a photovoltaic cell as claimed in claim 2, in which said etching is carried out by the use of an aqueous mixture of nitric, hydrofluoric and acetic acids.

4. A method of making a photovoltaic cell as claimed in claim 1, in which said etching is carried by the use of a caustic solution.

5. A method of making a photovoltaic cell as claimed in claim 4, in which said caustic solution is formed from an alkali metal hydroxide.

6. A method of making a photovoltaic cell as claimed in claim 1, in which said etching step is carried out at least until a substantial portion of the boundaries between adjoining grains have been etched away to form crevices extending between said adjoining grains, and said junction is then formed at said impingement surface and between said adjoining grains.

7. A method of making a photovoltaic cell as claimed in claim 5, in which said crevices extend between said adjoining grains for at least about one-quarter of the depth of said grains.

8. A wafer formed from grains of semicrystalline silicon and suitable for being made into a photovoltaic cell, said wafer being produced by the practice of any of the methods of claims 1, 5 or 6.

9. A method of making a photovoltaic cell as claimed in claim 1, in which said etching is carried out at room temperature.

10. A method of making a photovoltaic cell as claimed in claim 1, in which said photovoltaic junction is formed by diffusing an impurity into said surface.

* * * * *